(12) United States Patent
Melanson

(10) Patent No.: US 7,307,565 B1
(45) Date of Patent: Dec. 11, 2007

(54) SIGNAL PROCESSING SYSTEM WITH DELTA-SIGMA MODULATION AND FIR FILTER POST PROCESSING TO REDUCE NEAR OUT OF BAND NOISE

(75) Inventor: John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 11/315,549

(22) Filed: Dec. 22, 2005

(51) Int. Cl.
*H03M 3/00* (2006.01)

(52) U.S. Cl. .................. 341/143; 341/144; 341/152

(58) Field of Classification Search ........ 341/143–144, 341/152
See application file for complete search history.

(56) References Cited

U.S. PATENT DOCUMENTS

| | | | |
|---|---|---|---|
| 4,937,577 A * | 6/1990 | Rich et al. ................. | 341/143 |
| 5,323,157 A * | 6/1994 | Ledzius et al. ............ | 341/143 |
| 5,408,235 A * | 4/1995 | Doyle et al. ............... | 341/143 |
| 5,585,802 A * | 12/1996 | Cabler et al. .............. | 341/143 |
| 5,815,102 A | 9/1998 | Melanson | |
| 6,005,505 A * | 12/1999 | Linz ........................... | 341/143 |
| 6,150,969 A | 11/2000 | Melanson | |
| 6,280,391 B1 * | 8/2001 | Olson et al. ................ | 600/509 |
| 6,727,832 B1 | 4/2004 | Melanson | |
| 6,795,004 B2 * | 9/2004 | Masuda et al. ............ | 341/143 |
| 6,816,097 B2 * | 11/2004 | Brooks et al. ............. | 341/143 |
| 6,885,330 B2 * | 4/2005 | Trotter et al. .............. | 341/152 |

* cited by examiner

*Primary Examiner*—Khai M. Nguyen
(74) *Attorney, Agent, or Firm*—Hamilton & Terrile, LLP; Kent B. Chambers

(57) ABSTRACT

A signal processing system matches, within a band of near out-of-band frequencies, the frequency response trends of a delta sigma modulator noise transfer function (NTF) and frequency response trends of a low pass finite impulse response (FIR) filter to provide noise attenuation in in-band frequencies and near out-of-band frequencies. More specifically, in at least one embodiment, the signal processing system matches, within the band of near out-of-band frequencies, a gradient trending toward increasing energy as the near out-of-band frequencies increase of the NTF with a gradient trending toward increasing attenuation by a FIR filter to improve attenuation of near out-of-band energy in an output signal of the signal processing system. Operation of the delta sigma modulator generates near out-of-band noise. Improving attenuation of the near out-of-band energy helps prevent the near out-of-band energy from being modulated into in-band frequencies, i.e. frequencies of a signal of interest.

40 Claims, 9 Drawing Sheets

US 7,307,565 B1

SIGNAL PROCESSING SYSTEM WITH DELTA-SIGMA MODULATION AND FIR FILTER POST PROCESSING TO REDUCE NEAR OUT OF BAND NOISE

BACKGROUND OF THE INVENTION

1. Field of the Invention

The present invention relates in general to the field of information processing, and more specifically to a system and method for reducing near out-of-band noise using a delta sigma modulator and a finite impulse response post-processing filter.

2. Description of the Related Art

Many electronic systems employ signal processing technology to process analog, digital, or a mix of analog and digital signals. In audio applications, the digital to analog conversion process often involves oversampling a digital signal, modulating the signal using a delta-sigma modulator to shape noise associated with quantizing the digital signal, and performing a digital to analog conversion using a low-pass filter. The filtered output signal is used in a variety of ways, such as stored as digital data or amplified to produce an analog signal suitable for driving a load such as a speaker.

Delta-sigma modulators receive an input signal and convert the signal into a series of low resolution pulses having an average amplitude over time proportional to the input signal. In the process of producing a modulated output signal, delta-sigma modulators introduce quantization noise into the modulated input signal. However, the quantization noise advantageously resides outside of the audio baseband where frequency components of interest reside, i.e. between about 0 Hz and about 20-25 kHz. Thus, in an audio context, "in-band" refers to frequencies between 0 Hz and about 20-25 kHz, and out-of-band frequencies refer to frequencies above the maximum in-band frequency. "Delta-sigma modulators" are also commonly referred to using other interchangeable terms such as "sigma-delta modulators", "delta-sigma converters", "sigma delta converters", "data converters", "noise shapers", as well as full and partial combinations of the foregoing terms.

FIG. 1 depicts a signal processing system 100 that converts an input signal 101 generated by source 102 into an output signal 104. The source 102 can be any data signal source such as a compact disk player, a digital versatile disk player, and other audio signal sources. The input signal 101 generally undergoes pre-processing by preprocessor 106. In an audio system context, in preparation for processing by delta sigma modulator 108, pre-processing generally involves over-sampling input signal 101. Thus, for an audio signal sampled at 48 kHz and an oversampling ration of 128:1, pre-processor 106 generates an input signal x(n) ("X(z)" in the z-domain) with a sampling frequency of 6.144 MHz.

The M-bit delta sigma modulator 108 represents a general depiction of an M-bit delta sigma modulator. The delta sigma modulator 108 provides a series of low resolution pulses whose average value over time represents delta sigma modulator input signal X(z), where M is an integer representing the number of bits used by the delta sigma modulator 108 to quantize an input to quantizer 110. For a single bit delta sigma modulator 110, M equals one (1). The loop filter 112 output signal U(z) is related to the input signal X(z) and the feedback signal $Y(z) \cdot z^{-1}$ by Equation [1]:

$$U(z) = X(z) \cdot H_1(z) + Y(z) \cdot H_2(z) \cdot z^{-1} \qquad [1]$$

Because delta sigma modulator 108 introduces quantization error noise E(z) at the quantizer 110, the loop filter 112 can be characterized by two transfer functions: (i) a signal transfer function (STF) and (ii) a noise transfer function (NTF). The STF(z) is related to $H_1(z)$ and $H_2(z)$ by Equation [2], and the NTF(z) is related to $H_2(z)$ by Equation [3]:

$$STF(z) = \frac{H_1(z)}{1 - z^{-1} \cdot H_2(z)}; \qquad [2]$$

$$NTF(z) = \frac{1}{1 - z^{-1} \cdot H_2(z)}, \qquad [3]$$

Each NTF has a numerator and a denominator. "Zeros" represent roots of the NTF numerator that cause the NTF to equal zero or at least a very small number that for practical purposes approximates zero (collectively referred to herein as a "zero"). "Poles" represent roots of the NTF denominator that cause the NTF to equal infinity (e.g. a division by zero) or at least a very large number that for practical purposes approximates infinity or a maximum voltage or current swing of a system.

FIG. 2 depicts a $5^{th}$ order delta sigma modulator 200, which is an embodiment of delta sigma modulator 108. The loop filter 202 includes 5 integrators 204.0, 204.1, ..., 204.4. Filter coefficients $c_i$ to obtain a desired STF and NTF can be, for example, included in the feedback loop. The feedback signal $Y(z) \cdot z^{-1}$ (i.e. the previous output y(n−1)) is fed back and, thus, modified by a coefficient $c_i$, where $i \in \{0, 1, \ldots, 4\}$. The values of each coefficient $c_i$ are a matter of design choice. Integrator 204.0 integrates the difference between input signal X(z) and a delayed quantizer output feedback signal $Y(z) \cdot z^{-1}$ as modified by coefficient $c_0$. Integrators 204.2 and 204.4 integrate a difference between $Y(z) \cdot z^{-1}$, as adjusted by respective coefficients $c_2$ and $c_4$, and an output of the respective previous integrator 204.1 and 204.3. Resonators 208 and 210 provide poles in the transfer function of loop filter 202. Resonators 208 and 210 have respective gains $-g_0$ and $g_1$. The values of $-g_1$ and $-g_2$ are a matter of design choice. Integrator 204.1 integrates $-[c_1 \cdot Y(z) \cdot z^{-1} + g_0 \cdot V_2(z)] + V_0(z)$, where $V_i(z)$ is the output of the $i^{th}$ integrator 204. Integrator 204.3 integrates $-[c_3 \cdot Y(z) \cdot z^{-1} + g_1 \cdot V_4(z)] + V_2(z)$. The $i^{th}$ integrator 204.$i$ performs a process that determines a difference between an input A(z) and a delayed integrator output B(z) such that the integrator transfer function, $H(z)_{integrator}$, is represented by Equation [1]:

$$H(z)_{integrator} = \frac{A(z)}{B(z)} = \frac{1}{1 - z^{-1}} \qquad [1]$$

The quantizer 206 produces a quantization error E(z), which represents noise produced by the delta sigma modulator 200. The $N^{th}$ order delta sigma modulator output signal Y(z) can be defined in terms of the input signal X(z), the error E(z), the STF of the loop filter 202, and the NTF of the loop filter 202 as set forth in the z-domain Equation [5]:

$$Y(z) = STF(z) \cdot X(z) + NTF(z) \cdot E(z) \qquad [5]$$

For loop filter 202, STF(z) is an all pole response that is relatively flat in the in-band frequencies and rolls off at higher frequencies, and $NTF(z) = (1-z^{-1})^N$. Delta sigma modulators can be implemented using a vast array of configurations that are well discussed extensively in the literature such as *Delta Sigma Data Converters—Theory, Design,* and Simulation, Norsworthy, Schreier, and Temes, IEEE Press (1997) and *Understanding Delta-Sigma Data Converters*, Schreier and Temes, IEEE Press (2005).

FIG. 3 depicts an exemplary $5^{th}$ order NTF 300 in the z-domain. The five zeros ("0") of the NTF 300 are separated within the in-band frequencies, and the five poles ("X") are located within the unit circle surrounding the in-band frequencies. *Understanding Delta-Sigma Data Converters* states, "Spreading the zeros reduces the total noise power in the signal band, while moving the poles nearer to the zeros reduces the out-of-band NTF gain, resulting in improved stability." *Understanding Delta-Sigma Data Converters*, p. 107.

FIG. 4 depicts the frequency response 400 of the $5^{th}$ order NTF 300. The frequency response 400 exhibits a steep rise, i.e. a steep decline in attenuation, after the baseband frequency $f_b$.

Referring back to FIG. 1, the signal processing system 100 also includes post-processor 114 to prepare the output signal Y(z) for one or more output devices, such as audio speakers or an audio data storage device. Post-processor 114 processes the output signal Y(z) of delta sigma modulator 108 to prepare output signal Y(z) for its intended use. Post-processor 114 often includes a digital-to-analog converter and a low-pass filter which largely remove out-of-band noise from the output signal Y(z) to generate the output signal 104. Near out-of-band noise is very difficult to remove. Attempts to remove near out-of-band noise generally involve multi-stage filters and large capacitors. However, near out-of-band energy remains and can cause a variety of undesirable effects. For example, subsequent signal processing of a signal with near out-of-band noise can introduce modulation frequencies that modulate the near out-of-band energy back into in-band frequencies, thus, introducing in-band noise. For example, jitter modulation commonly exists in decoders decoding Sony-Philips Digital Interface Format (SPDIF) signals. The jitter modulation can problematically modulate the near out-of-band energy back into the in-band frequencies, thus, introducing unwanted noise. In addition to modulation of near out-of-band noise into in-band frequencies, near out-of-band noise can cause other problems as well. For example, some audio amplifiers do not function satisfactorily when near out-of-band noise is present in a signal to be amplified.

SUMMARY OF THE INVENTION

In one embodiment of the present invention, a signal processing system comprising includes a delta-sigma modulator to process input data that includes in-band frequency data. The signal processing system also includes a finite impulse response (FIR) filter to process data previously processed by the delta sigma modulator. The delta sigma modulator includes a noise transfer function having a gradient trending toward increasing energy as the near out-of-band frequencies increase that matches a gradient trending toward increasing attenuation by the filter as the near out-of-band frequencies increase to attenuate energy in the near out-of-band frequencies.

In another embodiment of the present invention, a signal processing system includes a delta-sigma modulator having a low pass noise transfer function that includes a pole in the z-domain with an absolute value less than or equal to 0.5. the signal processing system also includes a finite impulse response (FIR) filter coupled to an output of the delta sigma modulator, wherein a transfer function of the FIR filter is characterized by a low-pass frequency response.

In a further embodiment of the present invention, a method of reducing near out-of-band noise in a signal processing system includes processing noise in a delta sigma modulator in accordance with a noise transfer function, wherein the noise transfer function is characterized by a gradient trending toward increasing energy as near out-of-band frequencies increase. The method also includes filtering a signal previously modulated by the delta sigma modulator in accordance with a finite impulse response (FIR) filter transfer function characterized by a gradient trending toward increasing attenuation as near out-of-band frequencies increase that matches the gradient of the noise transfer function with the gradient of the FIR filter transfer function, wherein the noise transfer function gradient matches the FIR filter transfer function to attenuate energy in the near out-of-band frequencies.

In another embodiment of the present invention, a method of reducing near out-of-band noise in a signal processing system includes processing an input signal using a delta sigma modulator, wherein the input signal includes in-band frequencies and a noise transfer function of the delta sigma modulator includes (i) a pole in the z-domain with an absolute value less than or equal to 0.5 and (ii) one or more zeros to suppress in-band noise data. The method also includes filtering a signal previously processed by the delta sigma modulator with a finite impulse response (FIR) filter having a transfer function characterized by a low pass frequency response.

In a further embodiment of the present invention, a signal processing system includes means for processing an input signal using a delta sigma modulator, wherein the input signal includes in-band frequencies and a noise transfer function of the delta sigma modulator includes (i) a pole in the z-domain with an absolute value less than or equal to 0.5 and (ii) one or more zeros to suppress in-band noise data. The signal processing system also includes means, coupled to the means for processing, for filtering a signal previously processed by the delta sigma modulator with a finite impulse response (FIR) filter having a transfer function characterized by a low pass frequency response.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

A signal processing system matches, within a band of near out-of-band frequencies, the frequency response trends of a delta sigma modulator noise transfer function (NTF) and frequency response trends of a low pass finite impulse response (FIR) filter to provide noise attenuation in the in-band frequencies and near out-of-band frequencies. More specifically, in at least one embodiment, the signal processing system matches, within the band of near out-of-band frequencies, a gradient trending toward increasing energy as the near out-of-band frequencies increase of the NTF with a gradient trending toward increasing attenuation by a FIR filter to improve attenuation of near out-of-band energy in an output signal of the signal processing system. Operation of the delta sigma modulator generates near out-of-band noise. Improving attenuation of the near out-of-band energy helps prevent the near out-of-band energy from being modulated into in-band frequencies, i.e. frequencies of a signal of interest. In at least one embodiment, the NTF includes a pole having real and complex components within the range of zero to approximately zero and includes one or more in-band zeros. The FIR filter in at least one embodiment includes zeros distributed at various out-of-band frequencies.

Figure 5:
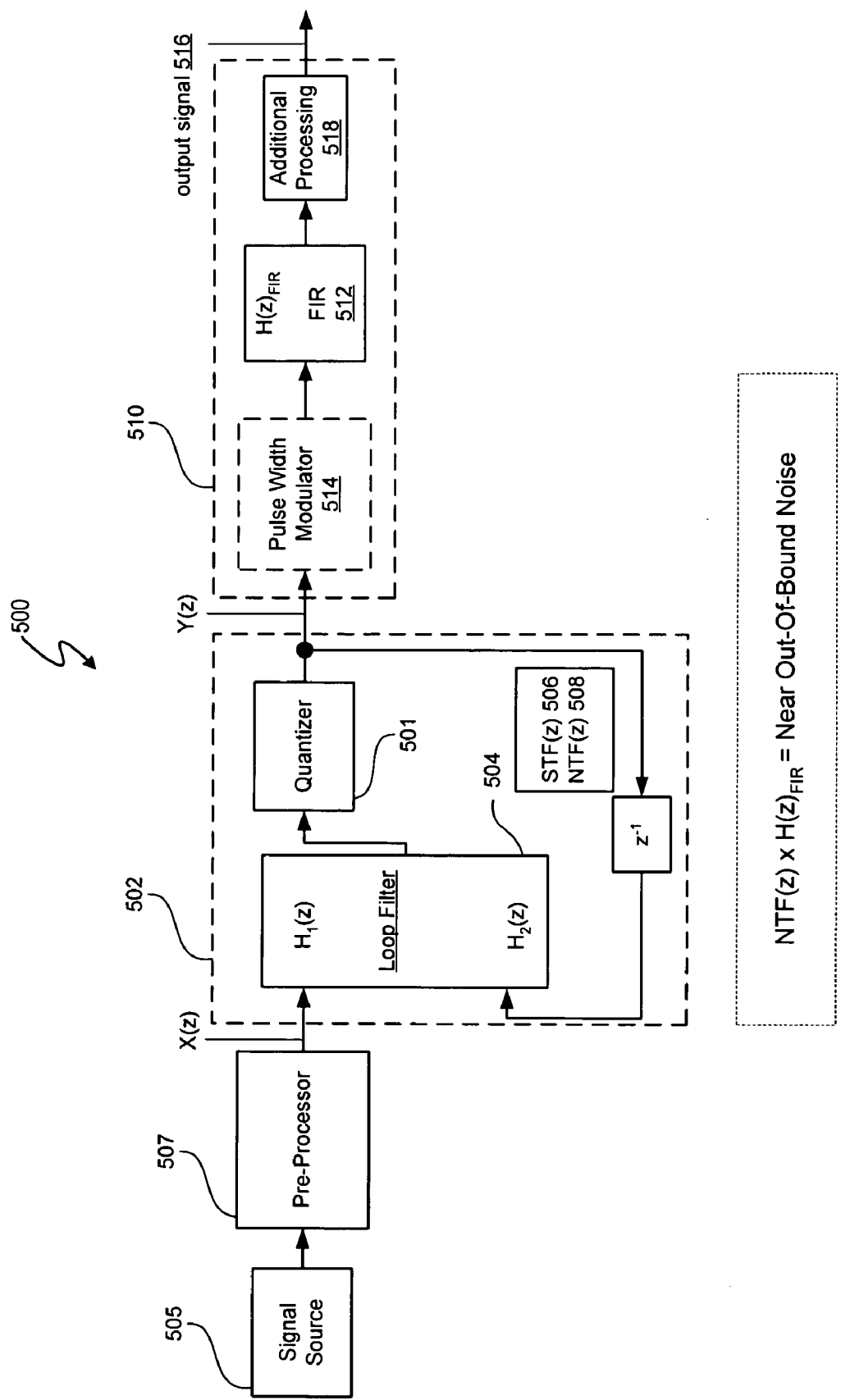
FIG. 5 depicts a signal processing system that includes a delta sigma modulator.

FIG. 5 depicts signal processing system 500 that includes a delta sigma modulator 502 to receive and process delta sigma modulator input signal X(z). Signal source 505 provides an initial input signal, and the initial input signal is typically processed by pre-processor 507. In at least one embodiment, signal source 505 and pre-processor 507 are the same as respective signal source 102 and pre-processor 106, and the input signal X(z) is an audio signal. The delta sigma modulator 502 includes an M-bit quantizer 501 that quantizes an output signal of loop filter 504 and generates an output signal Y(z). In at least one embodiment, M-bit quantizer 501 is the same as M-bit quantizer 110, and M is an integer representing the number of output bits of quantizer 501. The delta sigma modulator 502 has a signal transfer function (STF) 506 and a noise transfer function (NTF) 508 to process output signal Y(z) (fed back to loop filter 504) and the input signal X(z). The output signal Y(z) generally relates to the input signal X(z) and quantization error E(z) in accordance with Equation [5], which is reproduced below for convenience:

$$Y(z)=STF(z) \cdot X(z)+NTF(z) \cdot E(z) \quad [5]$$

In at least one embodiment, the STF 506 functions in the same manner as the STF of loop filter 112. The NTF 508 is explained in more detail below.

Post-processor 510 includes a low pass finite impulse response (FIR) filter 512 that attenuates noise at various out-of-band frequencies. In at least one embodiment FIR filter 512 is a comb type filter or the convolution of two or more comb filters. In at least one embodiment, the post-processor 510 also includes an optional pulse width modulator 514. At least one embodiment of the combination of a pulse width modulator 514 and FIR filter 512 is described in U.S. Pat. Nos. 6,727,832, 6,150,969, and 5,815,102, inventor John L. Melanson, which are hereby incorporated by reference in their entirety. In at least one embodiment, the transfer function $H(z)_{FIR}$ of FIR filter 512 is designed as a low-pass filter to provide zeros at of out-of-band frequencies with non-trivial amplitudes. For example, in at least one embodiment, the transfer function $H(z)_{FIR}$ of FIR filter 512 provides zeros at frequencies corresponding to operational frequencies and corresponding harmonic frequencies of the pulse width modulator 514.

In at least one embodiment, in the frequency domain and within a band of near out-of-band frequencies, the frequency response of the NTF 508, characterized by a gradient trending toward increasing energy as frequency increases, matches a frequency response of the FIR filter 512, characterized by a gradient trending toward increasing attenuation as frequency increases, to improve attenuation of near out-of-band energy in an output signal of the signal processing system. Thus, from a quantitative view, the absolute values of the slopes of the NTF 508 frequency response and the FIR filter 512 frequency response match within any particular frequency range. The "match" between the NTF 508 frequency response and the FIR filter 512 frequency response refers to a relationship between the NTF 508 frequency response and the FIR filter 512 frequency response that is designed to improve attenuation of near out-of-band energy in the output signal. The "match" with relationship to the absolute value of the slopes of the NTF 508 and FIR filter 512 frequency response may be exact or approximate at any particular frequency, but, in either case, the match is designed to improve attenuation of near out-of-band energy in the output signal.

Conventional noise transfer functions are generally designed to have very low in-band noise energy in return for a steep gradient of increasing out-of-band energy as frequency increases. A relatively slow trend of increasing energy as frequency increases in near out-of-band frequencies is conventionally considered to be undesirable. In the frequency domain, low pass transfer function $H(z)_{FIR}$ exhibits a relatively shallow gradient trending towards an increase in attenuation of near out-of-band frequencies as frequency increases. However, by decreasing the energy versus frequency gradient of NTF 508 in the near out-of-band frequencies, NTF 508 approximately matches the gradient of increasing attenuation of near out-of-band frequencies by transfer function $H(z)_{FIR}$ to reduce near out-of-band energy relative to comparable, conventionally configured systems. Attenuation of near out-of-band energy helps reduce subsequent modulation of near out-of-band energy into in-band frequencies, and, thus, increases the signal-to-noise ratio of the output signal 516 of signal processing system 500.

The signal processing system 500 can also include additional processing 518 to further process an output of FIR filter 512. Additional processing includes, for example, an infinite impulse response filter and/or an RC filter to further attenuate out-of-band energy and/or equipment to record data onto one or more data storage media.

The range of frequencies representing "near out-of-band frequencies" depends upon a number of factors such as the range of frequencies extending from the in-band frequencies that are more likely to be modulated into the in-band frequencies. For example, jitter modulation is a range of frequencies that are close enough to the in-band frequencies to cause subsequent processing problems, such as problems with audio amplifiers, and/or a range of frequencies that are not generally filtered well by subsequent low-pass filters. In at least one embodiment, near out-of-band frequencies are one-half the inverse of the number of taps of a comb FIR filter times the sampling frequency. For example, in an audio context having a baseband frequency $f_b$=20 kHz, a 12 tap FIR filter, and a sampling frequency of 6.144 MHz, the near out-of-band upper frequency is 0.5·(1/12)·6.144 MHz=256 kHz. Accordingly, in at least one embodiment, the near out-of-band frequency range is 20 kHz to 256 kHz.

Figure 6:
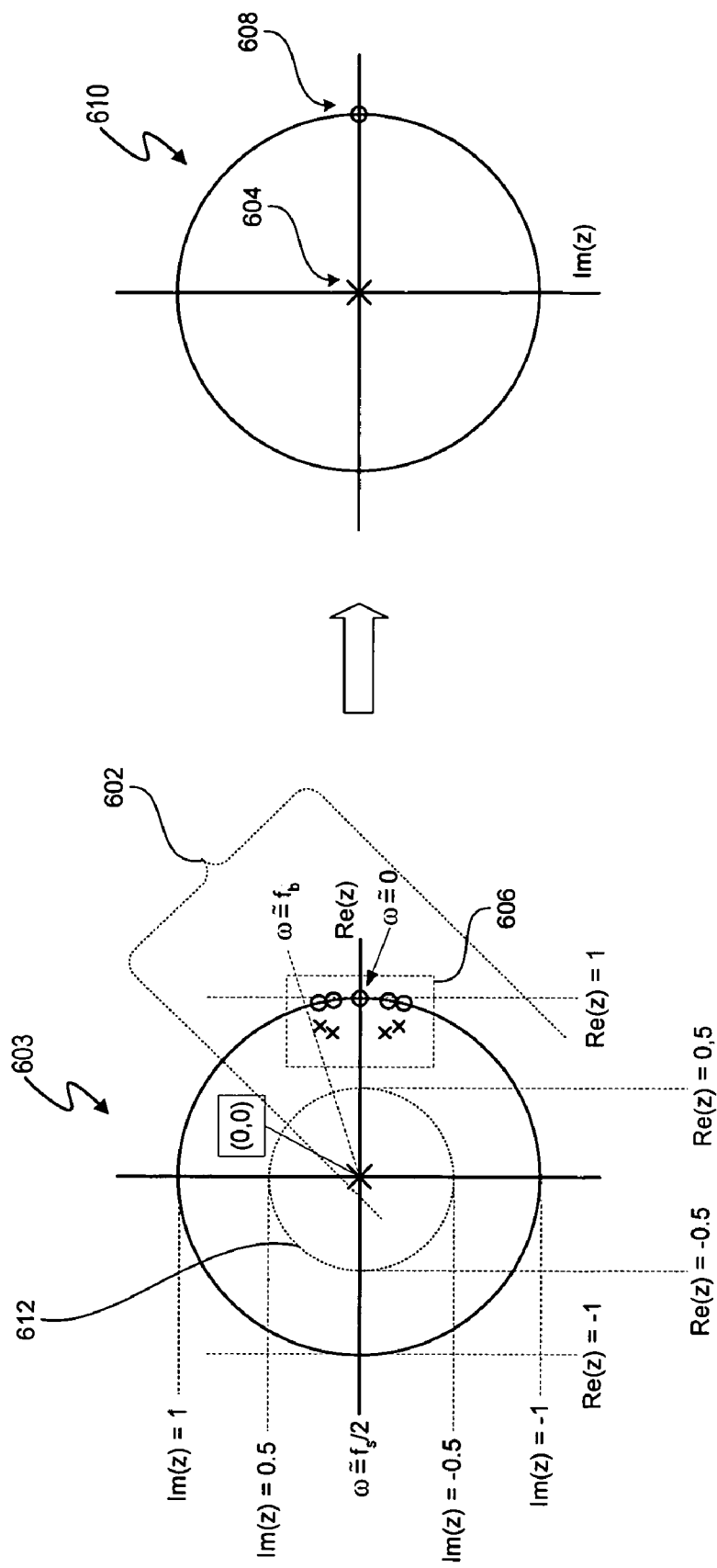
FIG. 6 depicts a noise transfer function in the z-domain of a delta sigma modulator loop filter.

Referring to FIGS. 5 and 6, the NTF 508 is designed to match the frequency response of FIR filter 512 to attenuate near out-of-band energy better than conventional systems. FIG. 6 depicts NTF 602, which represents one embodiment of NTF 508, in the z-domain of one embodiment of delta sigma modulator loop filter 504. NTF 602 represents a $5^{th}$ order embodiment of NTF 508 in an audio processing context, i.e. the in-band frequency range is, for example, 0 Hz to 20 kHz. NTF 602 is illustrated in FIG. 6 by the poles and zeros in a z-domain pole-zero plot 603. NTF 602 is 'technically' a $5^{th}$ order filter with a zero at ω=0, complex conjugate zeros at ω≈+/−0.9·$f_b$, and complex conjugate zeros at ω≈+/−0.75·$f_b$/2, where $f_b$ represents an audio baseband frequency of 20 kHz. NTF 602 also includes (i) four complex poles corresponding to the two pairs of complex conjugate zeros and (ii) a pole in the z-domain with an absolute value less than or equal to 0.5, i.e. a pole within a circle 612 having a radius of |z|●══●0.5. In at least one embodiment, the pole is at or at least very near the origin (0,0), i.e. (Re(z)=0, Im(z)=0), of z-domain plot 603. The frequency range of the z-domain plot of NTF 602 in box 606 is not to scale for an audio signal processing system using delta sigma modulation. When processing audio signals, the Nyquist frequency, i.e. $f_s$/2, for a 48 kHz sampled audio signal with a 128:1 oversampling ratio equals 3.072 MHz, i.e. 6.144/2 MHz). Thus, the frequency at z=−1 is $f_s$/2=3.072 MHz, which yields an $f_s$/2:$f_b$ ratio of 64:1. Accordingly, the five zeros and four poles in box 606 can be approximated by a single zero 608, as depicted in z-domain plot 610.

Figure 1:
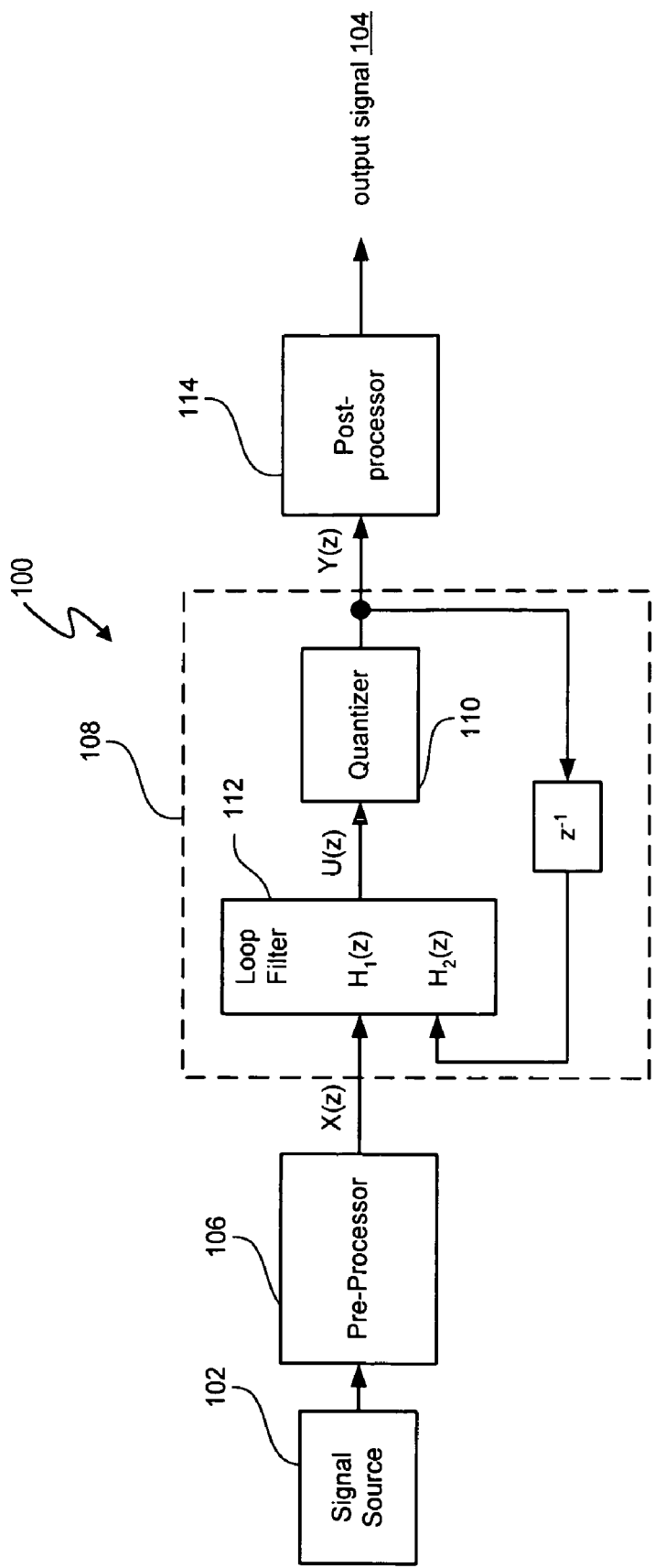
FIG. 1 (prior art) depicts a signal processing system that includes a delta sigma modulator.
Figure 2:
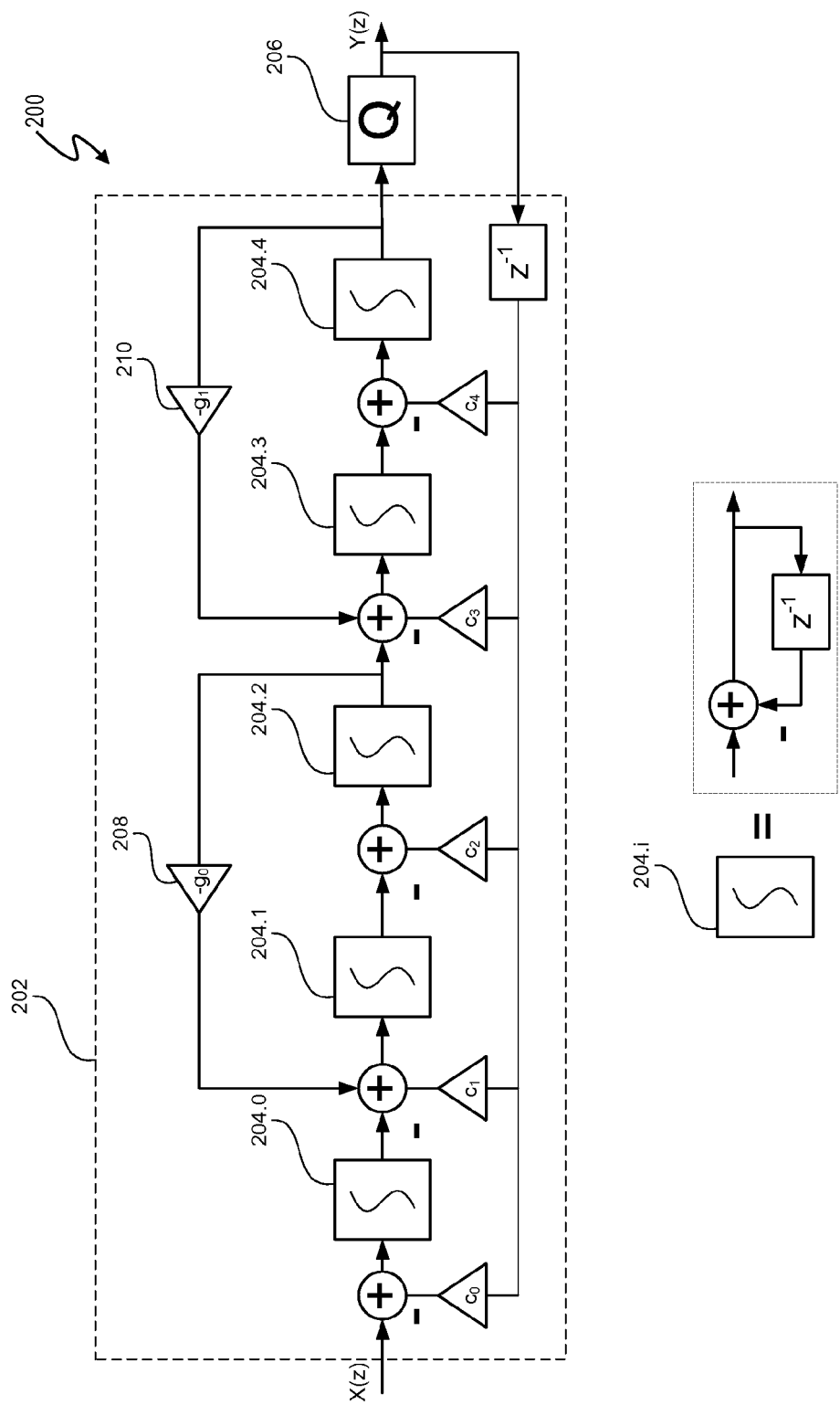
FIG. 2 (prior art) depicts an N-order delta sigma modulator.
Figure 3:
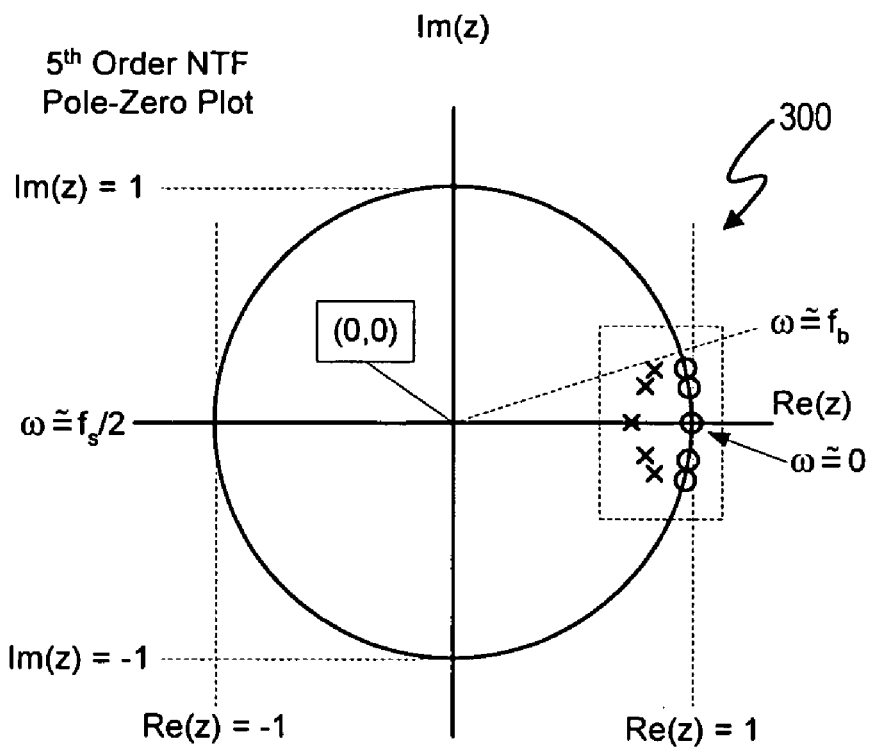
FIG. 3 (prior art) depicts a $5^{th}$ order delta sigma modulator noise transfer function in the z-domain.
Figure 4:
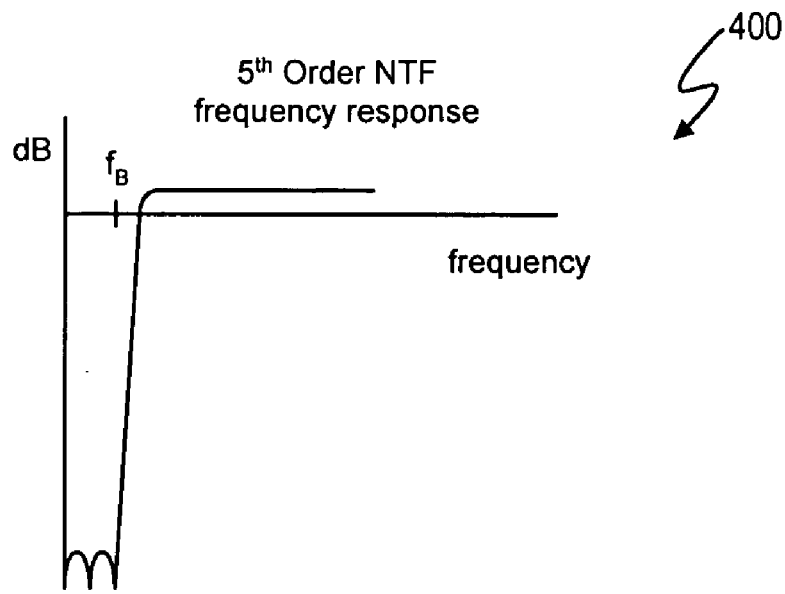
FIG. 4 (prior art) depicts the frequency response of the $5^{th}$ order delta sigma modulator noise transfer function of FIG. 3.
Figure 7:
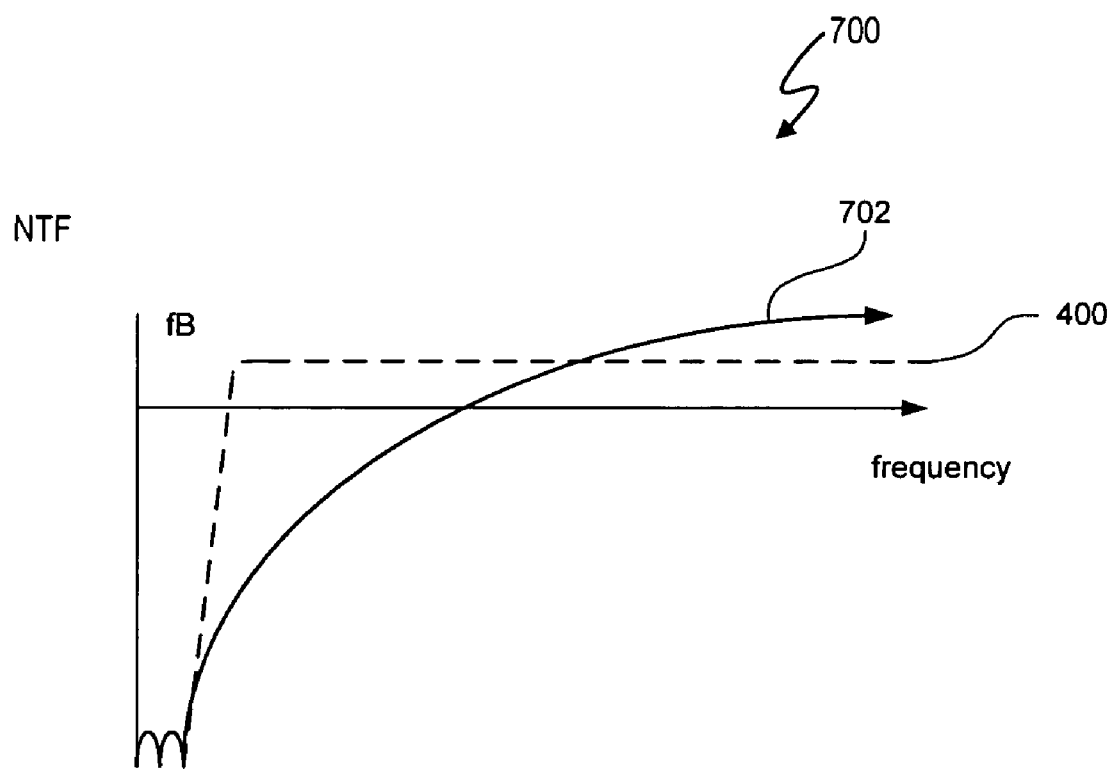
FIG. 7 depicts a comparison between a conventional $5^{th}$ order noise transfer function and the noise transfer function illustrated in FIG. 6.

FIG. 7 depicts the superposition 700 that compares a conventional $5^{th}$ order NTF with $5^{th}$ order NTF 602. The NTF 602 is 'technically' a $5^{th}$ order filter. However, since pole 604 has real and complex components within a range of zero to approximately zero, pole 604 functions as a unit delay and essentially has no effect on the frequency response of signal processing system 500. Thus, NTF 602 essentially behaves as a $4^{th}$ order filter. The dashed frequency response trace 400 represents the frequency response of conventional delta sigma modulator 108 with a $5^{th}$ order Butterworth NTF as shown in FIG. 4. The solid frequency response trace 702 represents an example frequency response of delta sigma modulator 502 with a $5^{th}$ order NTF 602. The response trace 702 is characterized by a gradient trending toward increasing energy as frequency increases. Because the pole 604 does not affect the frequency response of NTF 602, the frequency response of NTF 602 resembles a $4^{th}$ order Butterworth function. Although conventional wisdom indicates the desirability of moving NTF poles closer to z=1, the signal processing system 500 exhibits improved attenuation of near out-of-band energy.

Figure 8:
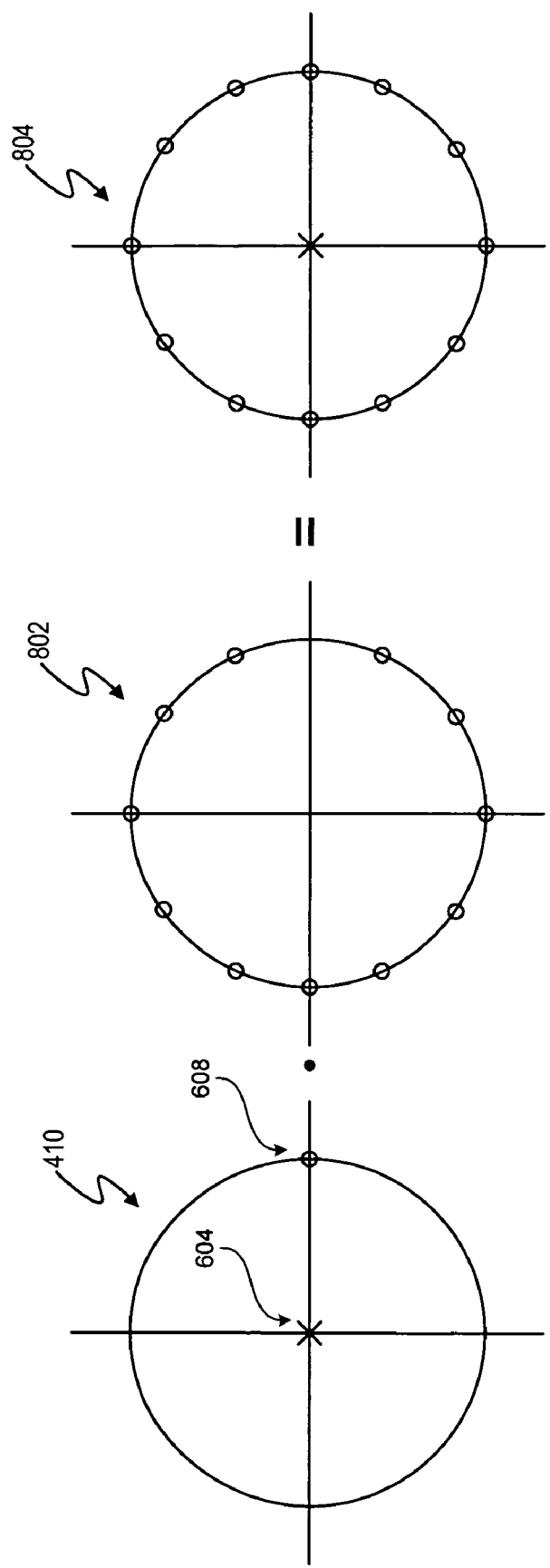
FIG. 8 depicts a combination in the z-domain of a delta sigma modulator loop filter noise transfer function and a post-delta sigma modulator finite impulse response transfer function.

FIG. 8 depicts the combination of one embodiment in the z-domain of transfer function $H(z)_{FIR}$ of FIR filter 512 and NTF 602. Plot 802 represents an embodiment of a 12 tap, $11^{th}$ order, low pass comb FIR transfer function $H(z)_{FIR}$ having the general form represented by Equation [2]:

$$H(z)_{FIR} = \frac{1 + z^{-1} + z^{-2} + \ldots + z^{-(N-1)}}{N}.$$ [2]

"N" is the order of the FIR filter, and N=11 in the embodiment of plot 802. In the embodiment of $H(z)_{FIR}$ represented by plot 802, the zeros are evenly distributed around the z-domain unit circle, except at z=ω=0, to attenuate operational frequencies and harmonics of pulse width modulator 514 as, for example, described in U.S. Pat. No. 6,727,832. The combination of plot 610 representing NTF 602 and plot 802 yields the z-domain plot 804. Plot 804 represents the noise transfer function of an embodiment of signal processing system 500. Thus, NTF 602 provides the missing zero in plot 802 to filter out in-band, near out-of-band, and the remaining out-of-band noise energy generated by delta sigma modulator 502 and other processes of signal processing system 500, such as pulse width modulator 514.

Figure 9:
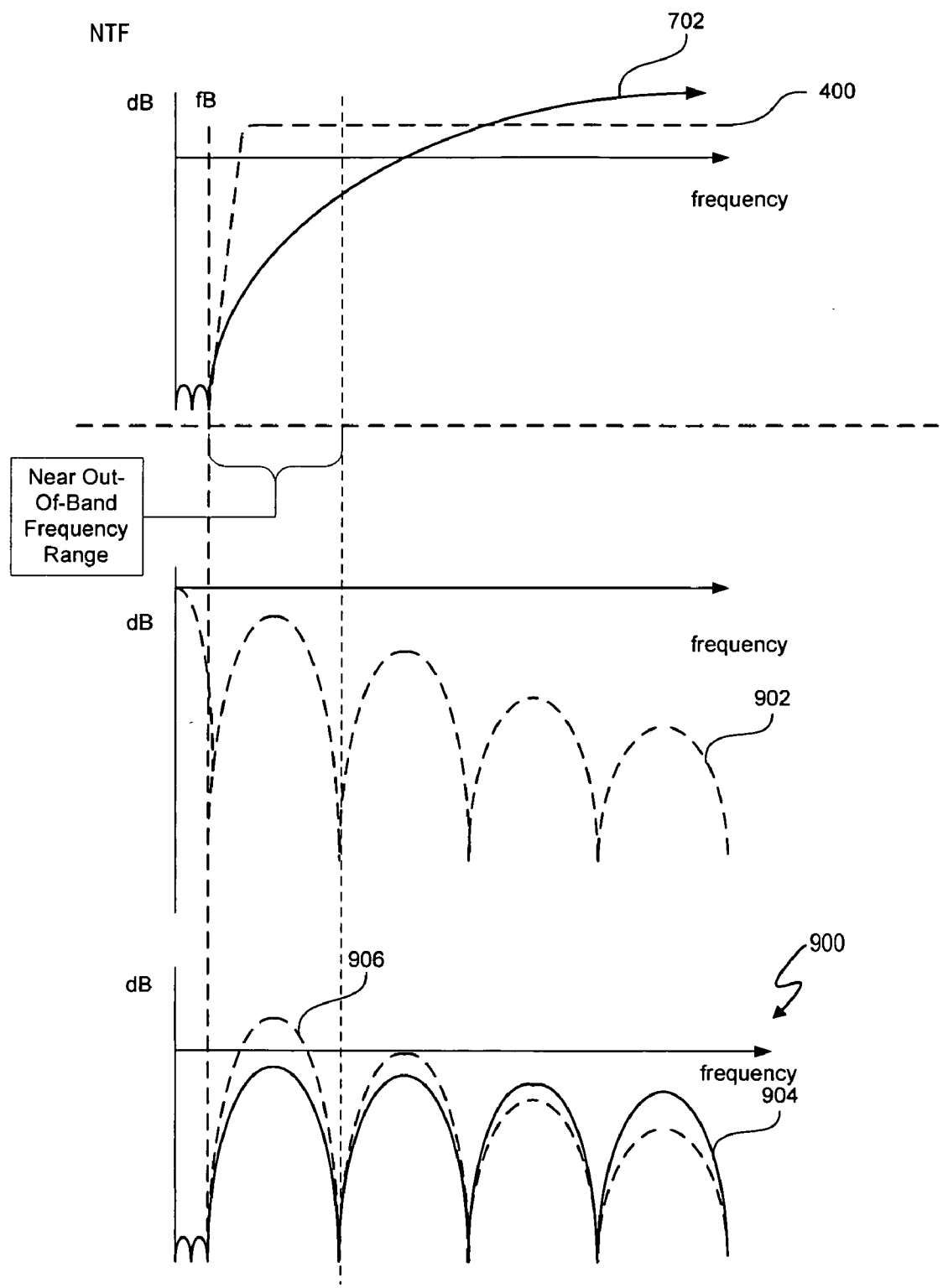
FIG. 9 depicts a new and conventional superposition of a delta sigma modulator loop filter noise transfer functions and a post-delta sigma modulator finite impulse response transfer functions.

FIG. 9 depicts a series of frequency responses culminating in the superposition 900 of NTF 602 matched with low pass $H(z)_{FIR}$ (solid line 904) and a combined frequency response of a conventional loop filter 112 NTF and low pass FIR filter (dashed line 906). Frequency response 902 represents one embodiment of the frequency response of FIR filter 512. The frequency response of the FIR filter 512 is characterized by a gradient trending toward increasing attenuation as frequency increases. In the near out-of-band frequencies, the frequency response 702 of the NTF 602, having a gradient trending toward increasing energy as the near out-of-band frequencies increases matches a gradient trending toward increasing attenuation by FIR filter 502. In at least one embodiment, in the frequency domain the match of frequency responses matches a positive slope associated with NTF 602 and a negative slope associated with FIR filter 512, so that with increasing frequency the NTF 602 results in less attenuation of near out-of-band frequencies while the frequency response of filter 512 results in more attenuation of near out-of-band frequencies. By matching the frequency response characteristics of the NTF 602 and FIR filter 512, signal processing system 500 improves attenuation of near out-of-band energy in an output signal of the signal processing system. An extra zero can be added at the Nyquist frequency $f_s$/2 to further attenuate very high frequencies, and/or an analog RC filter can be added to post-process 510 to attenuate very high frequency components of out-of-band energy.

Figure 10:
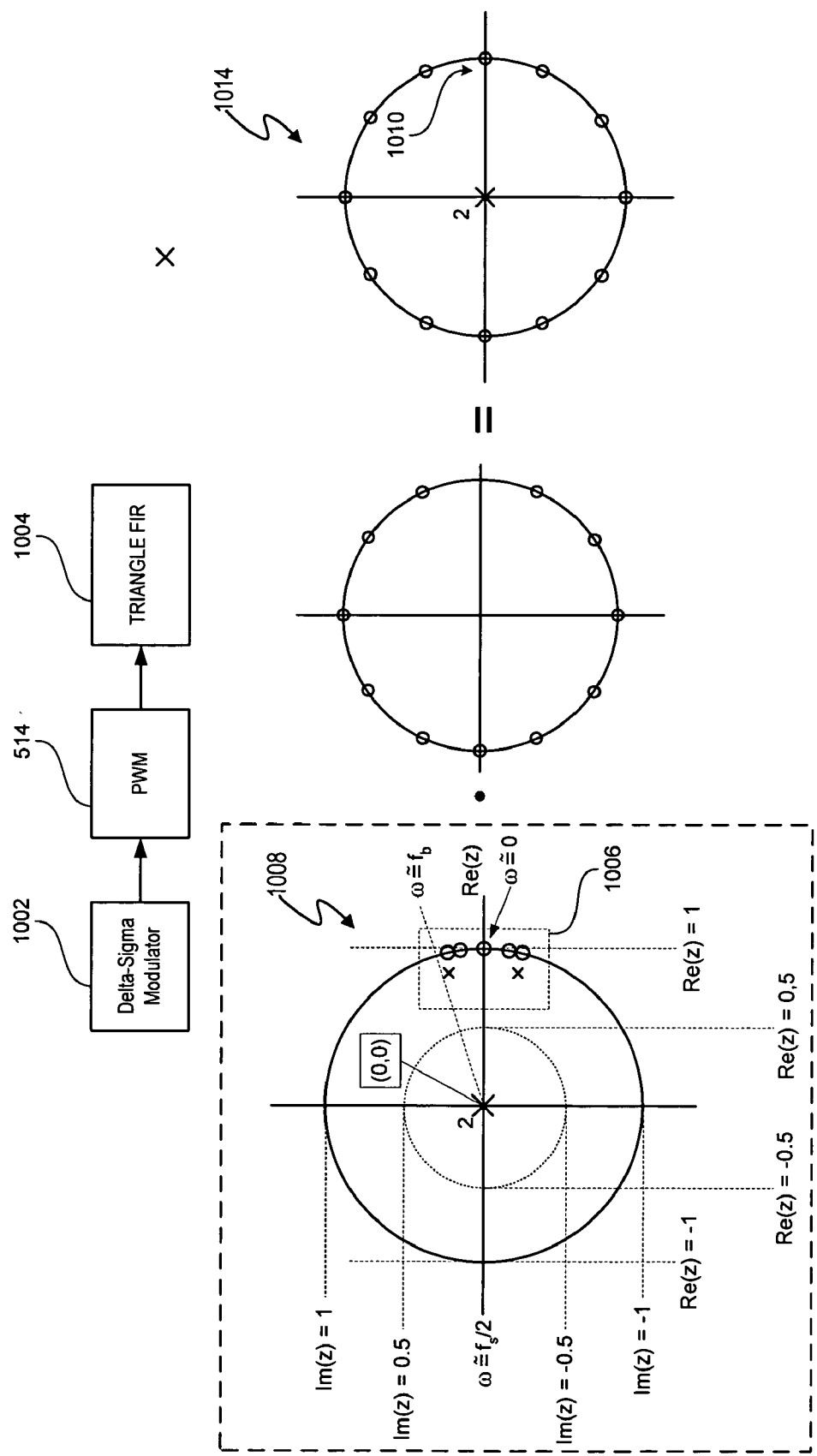
FIG. 10 depicts another embodiment of a delta sigma modulator with a post delta sigma modulator triangle finite impulse response filter.

Matching characteristics of frequency responses of the NTF of a delta sigma modulator and a subsequent low-pass filter to better attenuate near out-of-band energy can be implemented with a variety of signal processing system 500 configurations. For example, FIG. 10 depicts another embodiment of delta sigma modulator 502 and post-processor 510 with further improved out-of-band energy attenuation. A NTF of delta sigma modulator 1002 includes zeros distributed at in-band frequencies, two complex conjugate poles at +/−0.9·$f_b$, one real pole near z=1, and two real poles at z=0. The frequency range of box 1006 is not drawn to scale. In an audio context, $f_b$ is approximately 20 kHz, and at z=1, $f_s$/2=3.072 MHz. Thus, the zeros of the NTF 1008 can be approximated by a zero 1010. In addition to pulse width modulator 514, the pulse processor also includes low pass triangle FIR filter 1004. The triangle FIR filter 1004 has double zeros, which are, for example, evenly distributed at frequencies corresponding to operational and harmonic frequencies of the pulse width modulator 514. The triangle filter 1004 can be implemented by the convolution of two comb FIR filters. The NTF 1012 of triangle FIR filter 1004 combined with the complementary NTF 1008 of delta sigma modulator 1002 resolve into the NTF 1014 to provide improved near out-of-band energy attenuation and the out-of-band frequency range.

Signal processing system 500 can be implemented in any number of ways. For example, signal processing system 500 can be implemented using hardware, software, or combination of hardware and software. In at least one embodiment, the delta sigma modulator 502 is implemented in software and FIR filter 512 is implemented in hardware.

Thus, in a signal processing system, a delta sigma modulator with an NTF frequency response, characterized by a gradient trending toward increasing energy as frequency increases, matches a frequency response of a post-delta sigma modulator FIR filter 512, characterized by a gradient trending toward increasing attenuation as frequency increases, to improve attenuation of near out-of-band energy in an output signal of the signal processing system. The improved near out-of-band energy attenuation can be achieved using a delta sigma modulator NTF that, contrary to conventional practices, includes a pole that has no significant effect on the overall frequency response of a noise transfer function of signal processing system. The remaining poles and zeros of the NTF provide a gradient trending toward increasing energy as near out-of-band frequencies increase that matches a gradient trending toward increasing attenuation by a FIR filter. The resulting near out-of-band energy attenuation reduces modulation of near out-of-band frequencies into an in-band frequency range and constructively addresses other problems caused by near out-of-band noise.

Although the present invention has been described in detail, it should be understood that various changes, substitutions and alterations can be made hereto without departing from the spirit and scope of the invention as defined by the appended claims.

What is claimed is:

1. A signal processing system comprising:
an N-order delta-sigma modulator to process digital input data that includes in-band frequency data and generate digital output data, wherein N is an integer greater than or equal to 2;
a digital in-analog out finite impulse response (FIR) filter, coupled to an output of the delta sigma modulator, having a triangular impulse response to process digital data previously processed by the delta sigma modulator and to generate an analog output signal; and
a pulse width modulator to process data previously processed by the delta-sigma modulator and prior to processing by the FIR filter.

2. The signal processing system of claim 1 wherein:
the noise transfer function of the delta sigma modulator includes (i) two poles in the z-domain with an absolute value less than or equal to 0.5.

3. The signal processing system of claim 1 wherein the delta sigma modulator includes a noise transfer function having a gradient trending toward increasing energy as the near out-of-band frequencies increase that matches a gradient trending toward increasing attenuation by the filter as the near out-of-band frequencies increase to attenuate energy in the near out-of-band frequencies.

4. The signal processing system of claim 3 wherein a match between a gradient trending toward increasing energy as the near out-of-band frequencies increase and a gradient trending toward increasing attenuation by the FIR filter is an approximate match.

5. The signal processing system of claim 1 wherein the input signal comprises an audio signal.

6. The signal processing system of claim 1 wherein the delta sigma modulator and FIR filter are implemented using code stored in a memory and executable by a processor.

7. A signal processing system comprising:
an N-order delta-sigma modulator having a high pass noise transfer function that consists of a single pole in the z-domain with an absolute value less than or equal to 0.5 and further includes (i) N–1 poles having a real component in the z-domain greater than 0.5 and (ii) N zeros having a real component in the z-domain greater than or equal to 0.5 and N is an integer greater than or equal to 3; and
a finite impulse response (FIR) filter coupled to an output of the delta sigma modulator, wherein a transfer function of the FIR filter is characterized by a low-pass frequency response.

8. The signal processing system of claim 7 wherein the pole of the noise transfer function in the z-domain with an absolute value less than or equal to 0.5 has real and complex component values within a range of zero to approximately zero.

9. The signal processing system of claim 7 further comprising:
a pulse width modulator coupled between the delta sigma modulator and FIR filter.

10. The signal processing system of claim 9 wherein the transfer function of the FIR filter includes zeros at or near frequencies located at a modulation frequency of the pulse width modulator and harmonics of the modulation frequency.

11. The signal processing system of claim 7 wherein the N zeros of the noise transfer function of the delta sigma modulator are within a range of 0 Hertz and a maximum in-band frequency to suppress in-band noise signals.

12. The signal processing system of claim 7 wherein the FIR filter comprises a boxcar FIR filter.

13. The signal processing system of claim 7 wherein the input signal comprises an audio signal.

14. The signal processing system of claim 7 wherein the FIR filter comprises a convolution of multiple boxcar FIR filters.

15. The signal processing system of claim 14 wherein the convolution of the multiple boxcar FIR filters comprises a triangle FIR filter.

16. The signal processing system of claim 7 wherein the delta-sigma modulator is a digital-to-analog delta-sigma modulator and the FIR filter is a digital in-analog out FIR filter.

17. A method of reducing near out-of-band noise in a signal processing system, the method comprising:
receiving digital input data with an N-order delta-sigma modulator, wherein N is an integer greater than or equal to 2;
processing noise in the N-order delta sigma modulator in accordance with a noise transfer function;
filtering a signal previously modulated by the delta sigma modulator in accordance with a digital in-analog out finite impulse response (FIR) filter, wherein the FIR filter has a transfer function characterized by a triangular impulse response; and
prior to filtering, modulating an output signal of the delta sigma modulator using a pulse width modulator.

18. The method of claim 17 wherein the noise transfer function of the delta sigma modulator includes (i) two poles in the z-domain with an absolute value less than or equal to 0.5.

19. The method of claim 17 wherein the noise transfer function of the delta sigma modulator includes (i) a pole with real and complex component values within a range of zero to approximately zero and (ii) one or more zeros to suppress in-band noise data.

20. The method of claim 17 wherein the input signal comprises an audio signal.

21. The method of claim 17 wherein the noise transfer function is characterized by a gradient trending toward increasing energy as near out-of-band frequencies increase and the (FIR) filter transfer function is further characterized by a gradient trending toward increasing attenuation as near out-of-band frequencies increase that matches the gradient of the noise transfer function with the gradient of the FIR filter transfer function, and the noise transfer function gradient matches the FIR filter transfer function to attenuate energy in the near out-of-band frequencies.

22. The method of claim 21 wherein the match between a gradient trending toward increasing energy as the near out-of-band frequencies increase and a gradient trending toward increasing attenuation by the FIR filter is an approximate match.

23. A method of reducing near out-of-band noise in a signal processing system, the method comprising:
processing an input signal using a delta sigma modulator, wherein the input signal includes in-band frequencies and a noise transfer function of the delta sigma modulator consists of a single pole in the z-domain with an absolute value less than or equal to 0.5 and further includes (i) N−1 poles having a real component in the z-domain greater than 0.5 and (ii) N zeros having a real component in the z-domain greater than or equal to 0.5, and N is an integer greater than or equal to 3; and
filtering a signal previously processed by the delta sigma modulator with a finite impulse response (FIR) filter having a transfer function characterized by a low pass frequency response.

24. The method of claim 23 wherein the pole of the noise transfer function in the z-domain with an absolute value less than or equal to 0.5 has real and complex component values within a range of zero to approximately zero.

25. The method of claim 23 further comprising:
prior to filtering, modulating an output signal of the delta sigma modulator using a pulse width modulator.

26. The method of claim 25 wherein the transfer function of the FIR filter includes zeros at or near frequencies located at a modulation frequency of the pulse width modulator and harmonics of the modulation frequency.

27. The method of claim 23 wherein filtering the signal previously processed by the delta sigma modulator comprises filtering the signal using a convolution of multiple FIR filters.

28. The of claim 27 wherein filtering the signal using a convolution of multiple FIR filters comprises filtering the signal using a FIR filter having a triangle impulse response.

29. The method of claim 23 wherein filtering the signal comprises filtering the signal with a FIR filter having a transfer function with zeros spaced evenly between approximately 0 Hertz and one-half of the sampling frequency of the input signal.

30. The method of claim 23 wherein the input signal is an audio signal having a signal bandwidth, and a frequency response of the combined noise transfer function substantially eliminates near out-of-band noise generated by the delta sigma modulator.

31. The method of claim 23 further comprising:
converting an output of the FIR filter into an analog signal;
filtering the analog signal using a low-pass analog filter to generate a low-pass filtered signal; and
providing the low-pass filtered signal to an audio output device.

32. The method of claim 23 wherein the input signal comprises an audio signal.

33. The method of claim 23 further comprising:
means for pulse width modulating an output signal of the delta sigma modulator, wherein the means for pulse width modulating is coupled between the means for processing and the means for filtering.

34. The method of claim 23 wherein the delta-sigma modulator is a digital-to-analog delta-sigma modulator and the FIR filter is a digital in-analog out FIR filter.

35. A signal processing system comprising:
means for processing an input signal using a delta sigma modulator, wherein the input signal includes in-band frequencies and a noise transfer function of the delta sigma modulator consists of a single pole in the z-domain with an absolute value less than or equal to 0.5 and further includes (i) N−1 poles having a real component in the z-domain greater than 0.5 and (ii) N zeros having a real component in the z-domain greater than or equal to 0.5, and N is an integer greater than or equal to 3; and
means, coupled to the means for processing, for filtering a signal previously processed by the delta sigma modulator with a finite impulse response (FIR) filter having a transfer function characterized by a low pass frequency response.

36. The signal processing system of claim 35 wherein the delta-sigma modulator is a digital-to-analog delta-sigma modulator and the FIR filter is a digital in-analog out FIR filter.

37. A signal processing system comprising:
an N-order delta-sigma modulator to process digital input data that includes in-band frequency data and generate digital output data, wherein N is an integer greater than or equal to 2; and
a digital in-analog out finite impulse response (FIR) filter, coupled to an output of the delta sigma modulator, having a triangular impulse response to process digital data previously processed by the delta sigma modulator and to generate an analog output signal;
wherein the noise transfer function of the delta sigma modulator includes (i) two poles in the z-domain with an absolute value less than or equal to 0.5.

38. A method of reducing near out-of-band noise in a signal processing system, the method comprising:
receiving digital input data with an N-order delta-sigma modulator, wherein N is an integer greater than or equal to 2;
processing noise in the N-order delta sigma modulator in accordance with a noise transfer function; and
filtering a signal previously modulated by the delta sigma modulator in accordance with a digital in-analog out finite impulse response (FIR) filter, wherein the FIR filter has a transfer function characterized by a triangular impulse response;

wherein the noise transfer function of the delta sigma modulator includes (i) two poles in the z-domain with an absolute value less than or equal to 0.5.

39. A method of reducing near out-of-band noise in a signal processing system, the method comprising:
  receiving digital input data with an N-order delta-sigma modulator, wherein N is an integer greater than or equal to 2;
  processing noise in the N-order delta sigma modulator in accordance with a noise transfer function; and
  filtering a signal previously modulated by the delta sigma modulator in accordance with a digital in-analog out finite impulse response (FIR) filter, wherein the FIR filter has a transfer function characterized by a triangular impulse response;
  wherein the noise transfer function of the delta sigma modulator includes (i) a pole with real and complex component values within a range of zero to approximately zero and (ii) one or more zeros to suppress in-band noise data.

40. A method of reducing near out-of-band noise in a signal processing system, the method comprising:
  receiving digital input data with an N-order delta-sigma modulator, wherein N is an integer greater than or equal to 2;
  processing noise in the N-order delta sigma modulator in accordance with a noise transfer function; and
  filtering a signal previously modulated by the delta sigma modulator in accordance with a digital in-analog out finite impulse response (FIR) filter, wherein the FIR filter has a transfer function characterized by a triangular impulse response;
  wherein the noise transfer function is characterized by a gradient trending toward increasing energy as near out-of-band frequencies increase and the (FIR) filter transfer function is further characterized by a gradient trending toward increasing attenuation as near out-of-band frequencies increase that matches the gradient of the noise transfer function with the gradient of the FIR filter transfer function, and the noise transfer function gradient matches the FIR filter transfer function to attenuate energy in the near out-of-band frequencies.

* * * * *